United States Patent [19]

Brisson

[11] Patent Number: 4,954,787

[45] Date of Patent: Sep. 4, 1990

[54] AUDIO SIGNAL TRANSMISSION SYSTEM WITH NOISE SUPPRESSION NETWORK

[76] Inventor: Bruce A. Brisson, 3037 Grass Valley Hwy., Auburn, Calif. 95603

[21] Appl. No.: 354,517

[22] Filed: May 18, 1989

[51] Int. Cl.$^5$ .............................................. H03F 1/26
[52] U.S. Cl. ...................................... 330/149; 330/53; 381/94; 381/120
[58] Field of Search ................... 330/53, 149; 381/94, 381/120, 121

[56] References Cited

U.S. PATENT DOCUMENTS

| | | | |
|---|---|---|---|
| 4,177,431 | 12/1979 | Polk, Jr. ............................ | 381/94 X |
| 4,483,016 | 11/1984 | Hochstein et al. .................. | 381/120 |
| 4,649,565 | 3/1987 | Kaizer et al. ..................... | 381/121 X |

Primary Examiner—James B. Mullins
Attorney, Agent, or Firm—Fliesler, Dubb, Meyer & Lovejoy

[57] ABSTRACT

In an audio signal transmission system comprising an interface circuit is connected across the output terminals of an audio signal source or across the input terminals of an audio signal transmission cable coupled to the source. The interface circuit comprises either a discrete capacitance or a distributed capacitance in series with a discrete resistor. The value of the capacitance and the resistance in the interface circuit is chosen such that the time constant of the cable with the interface circuit produces in response to noise a signal having a frequency which is above the audio frequency spectrum but within the passband of the amplifier to which it is coupled.

10 Claims, 1 Drawing Sheet

AUDIO SIGNAL TRANSMISSION SYSTEM WITH NOISE SUPPRESSION NETWORK

BACKGROUND OF THE INVENTION

1. Field of the Invention

The present invention relates to audio signal transmission systems in general and in particular to the use of an RC network across the output of an audio signal source or across the input of an audio signal transmission cable coupled to such a source for reducing audible noise in such systems.

2. Description of the Prior Art

An audio signal transmission system of the type to which the present invention relates comprises an audio signal source, an audio signal transmission cable and a load. For example, the audio signal source may comprise an audio signal pre-amplifier, a power amplifier, a transducer or the like for providing signals in the audio frequency spectrum; the transmission cable may comprise a pair of parallel electrically insulated wires or a coaxial cable; and the load may comprise a pre-amplifier, a power amplifier, a speaker or other load depending on the source.

The audio frequency spectrum is generally considered to encompass a frequency range of from 20 Hz to 20,000 Hz.

Various means have been proposed for suppressing noise in audio signal transmission systems. For example, in U.S. Pat. No. 4,177,431 an interface circuit is provided for suppressing noise in a circuit comprising a power amplifier and a speaker coupled thereto by a "superspeaker" cable. The interface circuit, comprising a series coupled capacitor and resistor, is coupled between the superspeaker cable, which has low characteristic impedance, e.g. 9 ohms, and the speaker, which also has a low characteristic impedance of 4 to 16 ohms over the audio frequency range.

The patented interface network is provided for terminating the superspeaker cable at high frequencies, or in other words, to prevent spurious amplifier oscillations caused by reflections of high frequency signals due to the effect of the inductive portion of the loudspeaker impedance at high frequencies. The frequency of the spurious oscillations was found to be on the order of 1 megaHertz (1 mHz). To properly terminate the cable at that frequency, typical values chosen for the series resistor and capacitor were 6.2 ohms and 0.05 μF, respectively.

While possibly effective for suppressing 1 mHz noise caused by standing waves due to reflections on a transmission cable between a power amplifier and a speaker, the patented interface circuit does not address the problem of audio frequency noise.

Another disadvantage of the patented interface circuit concerns the fact that the suggested capacitance in the patented circuit is large and the resistance value is so small that instability and spurious oscillation of the power amplifier may occur.

It is well understood that under certain circumstances filter circuits coupled to the output of an amplifier having a resonant frequency outside the bandwidth of the amplifier to which they are coupled can cause the amplifier to oscillate. The resonant frequency associated with the RC time constant of the patented interface circuit is clearly outside the bandwidth of most audio frequency power amplifiers, and at the very limits of the more expensive commercial models which typically have a bandwidth of 20 Hz to 1 MHz.

SUMMARY OF THE INVENTION

In view of the foregoing, principal objects of the present invention are a novel method and apparatus for suppressing audible noise in an audio signal transmission system.

As discussed above, the typical audio signal transmission system comprises an amplifier for amplifying audio signals and a load coupled to the amplifier by means of an audio signal transmission cable.

In transmitting music and other audio signals having a broad range of frequencies from an audio signal source to a speaker, it was discovered that under certain conditions audible noise is generated which can adversely affect the quality of the music heard from the speaker. For example, in one investigation of the phenomenon using a frequency sweep generator, it was discovered that a 200 Hz signal produced noise on a cable comprising a frequency of about 8.3 kHz. In another investigation, a 310 Hz signal was found to produce noise on a cable having a different length comprising a frequency of 6.6 kHz. These frequencies are clearly within the audio frequency range and, therefore, audible. Noise at such frequencies can emphasize or pre-emphasize certain sounds at unwanted times and is therefore undesirable.

From an investigation of the physical mechanisms which give rise to the noise, it appears that at certain audio frequencies and under certain conditions, the inductance and/or capacitance of the cable can cause the cable to momentarily appear as an open circuit to the signal source. Under these conditions it has been observed that the magnitude of the signal, e.g. the 200 Hz signal, applied to the cable increases to a maximum and then suddenly decays across the gap, i.e. the dielectric separating the positive and return lines of the cable, producing a first order distortion to the applied audio signal comprising the 8.3 KHz noise described above. The discharge or decay time of this noise is attributed to the RC time constant created by the cable's own dielectrics used to separate the positive and return conductors. These dielectrics control not only the capacitance of the cable via their materials and thickness, but also have an equivalent resistance. This capacitance and equivalent resistance constitute the RC time constant as outlined above.

After the initial discharge has taken place across the gap between the two conductors through the dielectrics, a second order distortion takes place. This second order distortion manifests itself as a sustained resonance. This resonance rings down with a period that is substantially longer in time than that of the initial gap discharge, adding yet a second distortion to the applied audio signal.

Following the above investigation it was determined that if one controls the amplitude and period/frequency of the first order distortion, the second order distortion, i.e. the sustained resonance, will automatically be controlled, i.e. reduced, if not eliminated. The noise thus produced, if not eliminated, is amplified and superimposed on the applied signal causing distortion.

In accordance with the present invention, an audible noise suppressing interface circuit is coupled across the output of the amplifier, i.e. across the input of the transmission cable. The interface circuit comprises a series coupled capacitor and resistor, i.e. an RC network. The value of the capacitor and the resistor in the network is chosen such that the RC time constant of the combination of the cable with the network is well above the audio frequency spectrum, but still within the bandwidth of the amplifier. For example, in one embodiment of the present invention wherein the amplifier is a pre-amplifier having a typical bandwidth of 20 Hz to 150 kHz and an output impedance of 1.5k ohms to 10k ohms and the transmission cable is approximately 1 meter long and has a distributed capacitance C1 of approximately 300 pF, a discrete capacitor C2 and resistor R1 are used. The value of the capacitor C2 and the resistor R1 in the interface circuit are 1000 pF and 10k ohms, respectively. These values produce a time constant with a period t of 13 microseconds and raise the frequency f of the decay time of the first order distortion to 77 KHz from the previous 6.6 KHz or 8.3 KHz as in the preceding examples in accordance with the following general equations for the combined cable and interface circuit:

$$t = RC \quad (1)$$

$$f = 1/t \quad (2)$$

where $R = R1$ and $C = C1 + C2$

In another embodiment of the present invention, wherein the amplifier is a broad band power amplifier having a typical bandwidth of 20 Hz to 1 MHz and an output impedance of 4–16 ohms and the transmission cable is approximately 20 meters long and has a distributed capacitance C3 of 4.5nF/m, i.e. 90 nF, the interface network comprises a distributed capacitance C4 of 3000 pF which is provided by approximately 19.5 meters of unterminated coaxial cable and a discrete resistor R2 of 50 ohms. According to equations (1) and (2) above, the RC time constant (RE(C3+C4)) provides a frequency f approximately equal to 265 kHz for the combined cable and interface circuit, which is, once again, clearly above the audio frequency spectrum but well within the bandwidth of the amplifier.

While the value chosen for the capacitor C and a resistor R in the interface circuit may vary widely within the constraints discussed above, it is preferable that the resistor R have a value which is equal to or greater than the output impedance of the amplifier so as not to unduly load the amplifier down at high frequencies and that the value of C be as low as possible so as to save space.

Brief Description of the Drawings

The above and other objects, features and advantages of the present invention will become apparent from the following detailed description of the accompanying drawings, in which.

Detailed Description of the Invention

Figure 1:
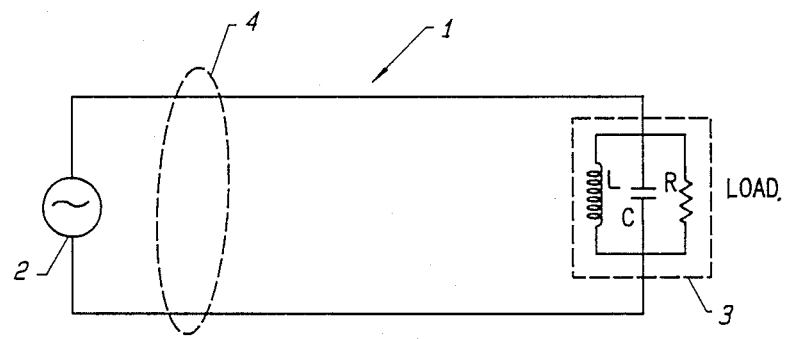
FIG. 1 is a schematic of a conventional audio signal transmission system.

Referring to FIG. 1 there is shown a conventional audio signal transmission system designated generally as 1. In the system 1 there is provided a source of audio signals 2 and a load 3 coupled to the source 2 by means of an audio signal transmission cable 4. The audio signal source 2 may comprise a pre-amplifier, a power amplifier, a transducer or the like. The load 3 may comprise a pre-amplifier, a power amplifier, a speaker or other load depending upon the nature of the source 2. Transmission cable 4 may comprise either a pair of parallel wires or a coaxial cable. For convenience, the load 3 is shown as comprising an equivalent circuit including a resistor R, a capacitor C and an inductor L.

In the operation of the system 1, noise has been observed being generated and amplified even though the source 2, load 3 and transmission cable 4 comprised expensive commercial apparatus. On investigation it was found that at certain audio frequencies the cable 4 momentarily appeared as an open circuit, causing the audio frequency signal to jump or bridge the gap, i.e. the dielectric, between the wires in the cable 4. The bridging of the gap by the audio signal produced observable and audible noise within the audio frequency spectrum.

For example, in one investigation of the phenomenon using an audio frequency sweep generator and an impedance measuring apparatus it was observed that at 310 Hz when the cable 4 became momentarily open-circuited, the capacitance and equivalent resistance between the positive and return lines of the cable were 210 pF and 725k ohms, respectively. The time constant of the circuit at these values was calculated to be 152 microseconds. According to equations (1) and (2) above, its frequency was calculated to be approximately 6.5 kHz, a frequency clearly within the audible frequency spectrum.

In another investigation, wherein cable 4 was of a different length than in the preceding example, using the sweep generator and the impedance measuring apparatus described above, it was observed that at 200 Hz, the cable 4 became momentarily open-circuited. Impedance measurements across the cable at that time showed a capacitance of 120 pF and an equivalent resistance of 1M ohm. Using equations (1) and (2) above, the RC time constant was calculated to be 120 microseconds and the first order distortion was calculated to be 8.3 kHz.

In both of the above examples, the noise generated was clearly within the audio frequency spectrum, was amplified by the amplifier 2, was audible, and thereby provided undesired enhancement of signals at the frequencies indicated.

Figure 2:
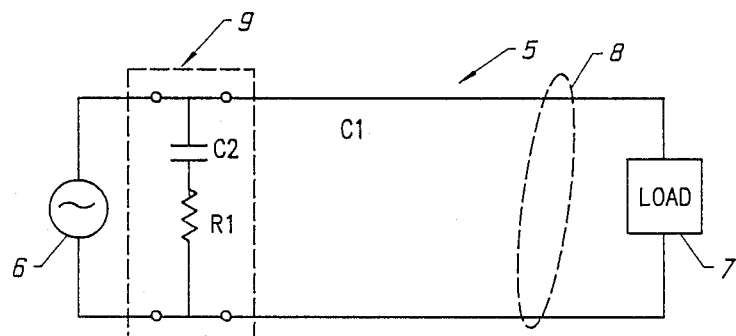
FIG. 2 is a schematic of an audio signal transmission system comprising a noise suppression interface circuit according to one embodiment of the present invention.

Referring to FIG. 2, there is shown an audio signal transmission system designated generally as 5. In the system 5 there is provided a high impedance pre-amplifier 6, a load 7 comprising a power amplifier, an audio frequency transmission cable 8 and, in accordance with the present invention, an audible noise suppressing interface circuit designated generally as 9. The pre-amplifier 6 typically comprises an output impedance of 1500 to 10K ohms. The power amplifier 7 typically comprises an input impedance of 50K ohms to .5M ohms. The cable 8 typically comprises a pair of parallel wires or a coaxial cable 1 to 2 meters in length and has a distributed capacitance C1 of approximately 300 pF.

In the interface circuit 9 there is provided a capacitor C2 and a series resistor R1. Using equations (1) and (2) above and assuming that the distributed capacitance C1 of the cable 8 is 300 pF, capacitor C2 has a value of 1000 pF and resistor R1 has a value of 10K ohms, the resulting RC time constant raises the frequency of the noise on the cable 8 with the interface circuit 9 to approximately 77 kHz.

Figure 3:
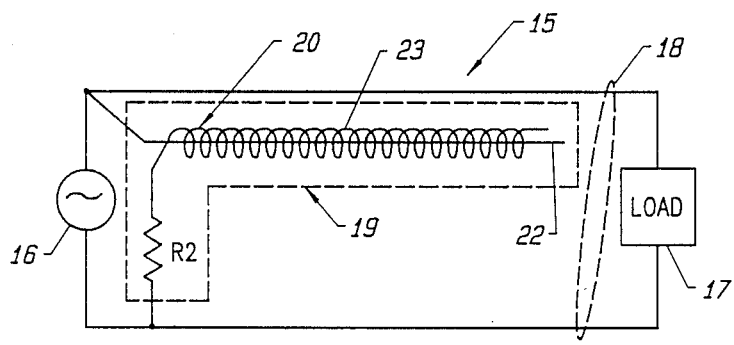
FIG. 3 is a schematic of an audio frequency transmission system comprising a noise suppressing interface circuit according to another embodiment of the present invention.

Referring to FIG. 3, there is shown another audio signal transmission system designated generally as 15. In the system 15 there is provided a power amplifier 16, a load 17, an audio signal transmission cable 18 and, in accordance with the present invention, an audible signal noise suppressing interface circuit designated generally as 19. The power amplifier 16 typically comprises an output impedance of 4 to 6 ohms and has a bandwidth of from 20 Hz to 1 MHz. The load 17 typically comprises a speaker having an impedance of 4 to 16 ohms over the audio frequency spectrum. The cable 18 comprises either a pair of parallel wires or a coaxial cable of from 10 to 20 meters in length and has a distributed capacitance C3 corresponding to the distributed capacitance C1 of cable 8, e.g. 90 nF.

In the interface circuit 19 there is provided a coaxial cable 20 and a resistor R2. The coaxial cable 20 comprises an inner conductor 22 and an outer conductor 23. One end of the inner conductor 22 is coupled to the positive side of the power amplifier 16 and the input end of the positive side of the cable 18. The corresponding end of the outer conductor 23 is coupled through the resistor R2 to the negative or return side of the power amplifier 16 and the input end of the negative side of the cable 18. The opposite ends of the center conductor 22 and the outer conductor 23 are left unterminated. Typically, the coaxial cable 20 comprises a distributed capacitance C4 equal to 3000 pF. The resistor R2 is typically 50 ohms.

Calculating the RC time constant of the cable 18 with the interface circuit 19 using equations (1) and (2) above, it will be found that the discharge frequency f of the combined cable and interface circuit is approximately 265 kHz. Clearly, this frequency is above the audio frequency spectrum but well within the bandwidth of the amplifier 16.

In practice, the interface circuit 9 of FIG. 2 can be located within the housing of the amplifier 6 connected across its positive and negative output terminals. Alternatively, the interface circuit 9 can be installed in a connector (not shown) used for connecting the positive and negative lines of the cable 8 to the output terminals of the amplifier 6.

In the case of the network 19, the coaxial cable 20 is preferably formed with the cable 18 with the center conductor coupled to the positive line in the cable 18 and the resistor R2 coupled to the negative line in the cable 18 in the connector used for connecting the cable 18 to the output terminals of the amplifier 16.

While preferred embodiments of the present invention have been described above, it is contemplated that various modifications may be made thereto without departing from the spirit and scope of the present invention. For example, while suggested values of C2, C4 R1 and R2 are given above, other values may be used so long as the RC time constant and resulting frequency of the decay time is above the audio frequency spectrum and within the bandwidth of the amplifier to which they are coupled. Accordingly, it is intended that the embodiments described be considered only as illustrative of the present invention and that the scope thereof be determined by reference to the claims hereinafter provided and their equivalents.

What is claimed is:

1. An audio signal transmission system with an audible noise suppression circuit comprising:
   amplifying means for amplifying audio signals, said amplifying means having a positive and a negative output terminal and a predetermined bandwidth;
   an audio signal transmission cable having a first distributed capacitance, a positive input terminal coupled to said positive output terminal of said amplifier and a negative input terminal coupled to said negative output terminal of said amplifier;
   means for providing a second capacitance which is coupled to said positive output terminal of said amplifier; and
   means for providing a resistance which is coupled between said second capacitance providing means and said negative output terminal of said amplifier, the total of said first and said second capacitances having a value C and said resistance having a value R such that the reciprocal of the decay time t defined by the equation:

$$t = RC$$

comprises a frequency $$f = 1/t$$

which is above the audio frequency spectrum and within said bandwidth of said amplifying means so as to prevent the generation of noise at audio frequencies in said system.

2. A system according to claim 1 wherein said second capacitance providing means comprises a descrete capacitor and said resistance providing means comprises a discrete resistor.

3. A system according to claim 1 wherein said second capacitance providing means comprises means for providing a distributed capacitance and said resistance providing means comprises a discrete resistor.

4. A method for suppressing audible noise in an audio signal transmission system having an amplifier with a positive output terminal and a negative output terminal and a load coupled to said positive and negative output terminals by an audio signal transmission cable having a positive line coupled to said positive output terminal of said amplifier and a return line coupled to said negative output terminal of said amplifier comprising the steps of:
   coupling a means for providing a capacitance to said positive output terminal of said amplifier; and
   coupling a means for providing a resistance between said means for providing a capacitance and said negative output terminal of said amplifier, the RC time constant of said capacitance and resistance being such that when combined with the RC time constant of said transmission cable, the resulting time constant comprises a frequency above 20 KHz and within the bandwidth of said amplifier so as to prevent the generation of noise at audio frequencies in said system.

5. A method according to claim 4 wherein said step of providing said capacitance and said resistance comprises the step of providing a distributed capacitance in series with a descrete resistance.

6. A method according to claim 4 wherein said step of providing said capacitance and said resistance comprises the step of providing a discrete capacitor in series with a discrete resistor.

7. In an audio signal transmission system having amplifying means for amplifying audio signals, said amplifying means having a positive and a negative output terminal and a predetermined bandwidth and an audio signal transmission cable having a first distributed capacitance, a positive input terminal coupled to said positive output terminal of said amplifying means and a negative input terminal coupled to said negative output terminal of said amplifying means, a method of suppressing audible noise comprising the steps of:

providing a second capacitance which is coupled to said positive output terminal of said amplifying means; and providing a resistance which is coupled between said second capacitance and said negative output terminal of said amplifying means, the total of said first and said second capacitances having a value C and said resistance having a value R such that the reciprocal of the decay time t defined by the equation:

$$t = RC$$

comprises a frequency $$f = 1/t$$

which is above the audio frequency spectrum and within said bandwidth of said amplifying means so as to prevent the generation of audio noise in said system.

8. A method according to claim 7 wherein said step of providing a second capacitance comprises the step of providing a discrete capacitor and said step of providing a resistance comprises the step of providing a discrete resistor.

9. A system according to claim 7 wherein said step of providing a second capacitance comprises the step of providing a distributed capacitance and said step of providing resistance comprises the step of providing a discrete resistor.

10. In an audio signal transmission system having an audio signal amplifier with a predetermined bandwidth coupled to a load by means of a positive and a return audio signal transmission line, said positive and return audio signal transmission lines having an RC time constant; and said amplifier having a positive output terminal, a negative output terminal, means for coupling said positive transmission line directly to said positive output terminal and said return transmission line directly to said negative output terminal, an audible noise suppression interface circuit comprising:

means for providing a capacitance which is coupled to said positive output terminal of said amplifier; and means for providing a resistance which is coupled between said capacitance providing means and said negative output terminal of said amplifier, said capacitance providing means and said resistance providing means having an RC time constant such that the combined RC time constant of said positive and return audio signal transmission lines and the RC time constant of said capacitance and resistance providing means comprises a frequency which is above 20 KHz but within said predetermined bandwidth of said amplifier so as to prevent the generation of noise at audio frequencies in said system.

* * * * *